United States Patent [19]
Brooks et al.

[11] Patent Number: 5,150,194
[45] Date of Patent: Sep. 22, 1992

[54] ANTI-BOW ZIP LEAD FRAME DESIGN

[75] Inventors: Jerry M. Brooks; Chender Huang, both of Boise, Id.

[73] Assignee: Micron Technology, Inc., Boise, Id.

[21] Appl. No.: 691,586

[22] Filed: Apr. 24, 1991

[51] Int. Cl.⁵ .................. H01L 23/48; H01L 23/12
[52] U.S. Cl. ........................................................ 357/70
[58] Field of Search ........................................ 357/70, 68

[56] References Cited

U.S. PATENT DOCUMENTS

| | | | |
|---|---|---|---|
| 4,482,915 | 11/1984 | Nishikawa et al. | 357/70 |
| 4,801,997 | 1/1989 | Ono et al. | 357/70 |
| 4,942,454 | 7/1990 | Mori et al. | 357/70 |
| 4,984,062 | 1/1991 | Uemura et al. | 357/70 |

FOREIGN PATENT DOCUMENTS

| | | | |
|---|---|---|---|
| 54-55169 | 2/1979 | Japan | 357/70 |
| 61-23351 | 1/1986 | Japan | 357/70 |
| 63-110763 | 10/1986 | Japan | 357/70 |

Primary Examiner—Rolf Hille
Assistant Examiner—S. V. Clark
Attorney, Agent, or Firm—Wayne E. Duffy

[57] ABSTRACT

A new and improved integrated circuit lead frame to be used to reduce bowing during the assembly of conventional microcircuits is described, wherein a conventional die attach paddle is supported on one side by at least one tie bar, extending conventionally between the paddle and the lead finger support structure also known as dam bars, and supported on the opposing side by a plurality of tie bars which are attached on their opposing ends to a novel support beam. This support beam extends between opposing side of the lead frame and provides independent support for the tie bars on the one side and permits dimensional and angular symmetry, similarity and parity to be achieved in the location of all of the tie bars in order to optimize the stability and integrity of the die pad and reduce bowing after the encapsulation process.

1 Claim, 3 Drawing Sheets

ANTI-BOW ZIP LEAD FRAME DESIGN

BACKGROUND OF THE INVENTION

1. Field of the Invention

This invention relates to fabrication technology used in the assembly of integrated circuit packages in the microcircuit manufacturing industries, with particular attention to lead frame design.

2. Description of the Prior Art

In standard industrial practice often the lead frame of an integrated circuit (IC) assembly is shaped so that the upper planar surface of the die attach pad is parallel to and slightly below the planar surface of the lead frame. This alignment or offset is usually achieved by "downsetting" the tie bars during the formation of the lead frame. This vertical offset provides a smaller overall cross sectional area for the encapsulated die and die attach pad in the finished integrated circuit package. The smaller area contributes to smaller package size, increased circuit density and often greater physical stability for the assembled package.

Unfortunately, however, fabrication experience has shown, in zig zag inline packages (ZIP) using only tie bars or having the two main tie bars normal to the third tie bar, that tie bars and die attach pads often bow or become distorted during the die attach and encapsulation processes resulting in improper spatial relationship of the die attach pad relative to the package causing excessive package bowing. This distortion causes mechanical and electrical failure within the integrated circuit packages and results in loss of system integrity and quality. Experience has also shown that lead frames having larger die attach pads, more lead fingers and longer tie bars seem more sensitive to physical distortion during encapsulation and trim and form steps and thus are more likely to produce more imperfect IC product per unit operation.

Typical configuration of the lead fingers in a conventional multiple lead zig zag inline (ZIP) lead frame is shown in FIG. 1 and will be discussed in detail later. It consists generally of a flat rectangular shaped die attach paddle which is held on the opposing ends of one longer side and on the same axis by tie bars which extend laterally outwardly and in the same plane as the die attach pad. These tie bars are attached on their opposing ends to respective opposing parallel sides of the lead frame and are downset therefrom in a conventional manner to the plane of the die attach pad as described. Conventional industry practice does not include the exposure of tie bars on the top of a ZIP configuration because of possible electrical shorting problems.

The die attach pad for a ZIP configuration typically also has an additional tie bar which extends normally outwardly and in the same plane from a point midway in the opposing longer side of the die attach pad, as shown in FIG. 2. This tie bar generally also is downset in a conventional manner to the plane of the die attach pad from the plane of the multiple lead fingers which usually are in the same plane and in parallel spaced relationship with the tie bars.

The intention of this invention is to provide a new and improved method of ZIP IC package fabrication which will reduce the failures due to bowing inherent in the present technology and insure greater IC unit integrity uniformity and strength.

BRIEF SUMMARY OF THE INVENTION

The present invention has been developed to prevent movement of the die attach pad before or during encapsulation which results in the improper spatial relationship of the die and die pad within the package outline for the ZIP configuration.

One problem involves fending of the tie bar when the die is not supported equilaterally and symmetrically, both horizontally and vertically, within the body of the ZIP lead frame, during the wire bonding and encapsulation steps of the IC assembly process. This distortion appears to occur because of unequal support of an uneven expansion of tie bars of unequal length, with unequal force vectors being applied to a die attach pad at non-symmetrical points in both the horizontal and vertical planes. Improper spatial relationship of the die, paddle, lead fingers and lead frame in the encapsulating plastic contribute to distortion and bowing of the package.

This invention provides more symmetrical suspension and support of the die and die attach paddle within the ZIP lead frame in order to compensate more equally for the stress forces created in the encapsulation of the IC assembly and also the additional tie bars do not protrude from the top of the package, thus prevent shorting from the top of the package while in the system application.

In this invention the typical 28 lead and 40 lead ZIP lead frame die attach paddle is held and supported on the long side of the paddle, which is farther from the lead fingers opposing the paddle, by two short tie bars, in parallel spaced relationship to each other.

These tie bars are approximately equidistant from each other and from the opposing ends of the long side of the die attach paddle. These tie bars are also attached on their opposing ends to a novel, single, long support beam, which extends parallel to the long side of the die attach pad and in the same plane as the lead frame. The short tie bars are downset in a known way from the long support beam to the die attach paddle.

The long side of the die attach paddle opposing the leads has a single tie bar located approximately midway between the ends of the paddle and downset in a known way between the planes of the lead frame and the paddle.

Thus the die attach pad is supported at three points, two on the long side, away from the lead fingers and one, opposing, approximately midway and on the same side as the lead fingers. All three of these tie bars are relatively short, parallel to each other, proportionally spaced and equally downset to position the die attach paddle in a plane parallel to and slightly below the plane of the lead frame, in a known way, which results in uniform deflection during wirebond clamping and prevents non-uniform deflection during encapsulation.

When the die, paddle and lead fingers are encapsulated, in a known way, the expansion and contraction of the assembled parts is then accommodated more equally and evenly by the dimensionally similar, shorter tie bars. This reduces the bowing and distorting of the ZIP package

DESCRIPTION OF THE PREFERRED EMBODIMENT

The present invention has been developed to overcome problems of ZIP lead frame bowing and distortion often encountered in the assembly and encapsulation of integrated circuits.

Figure 1:
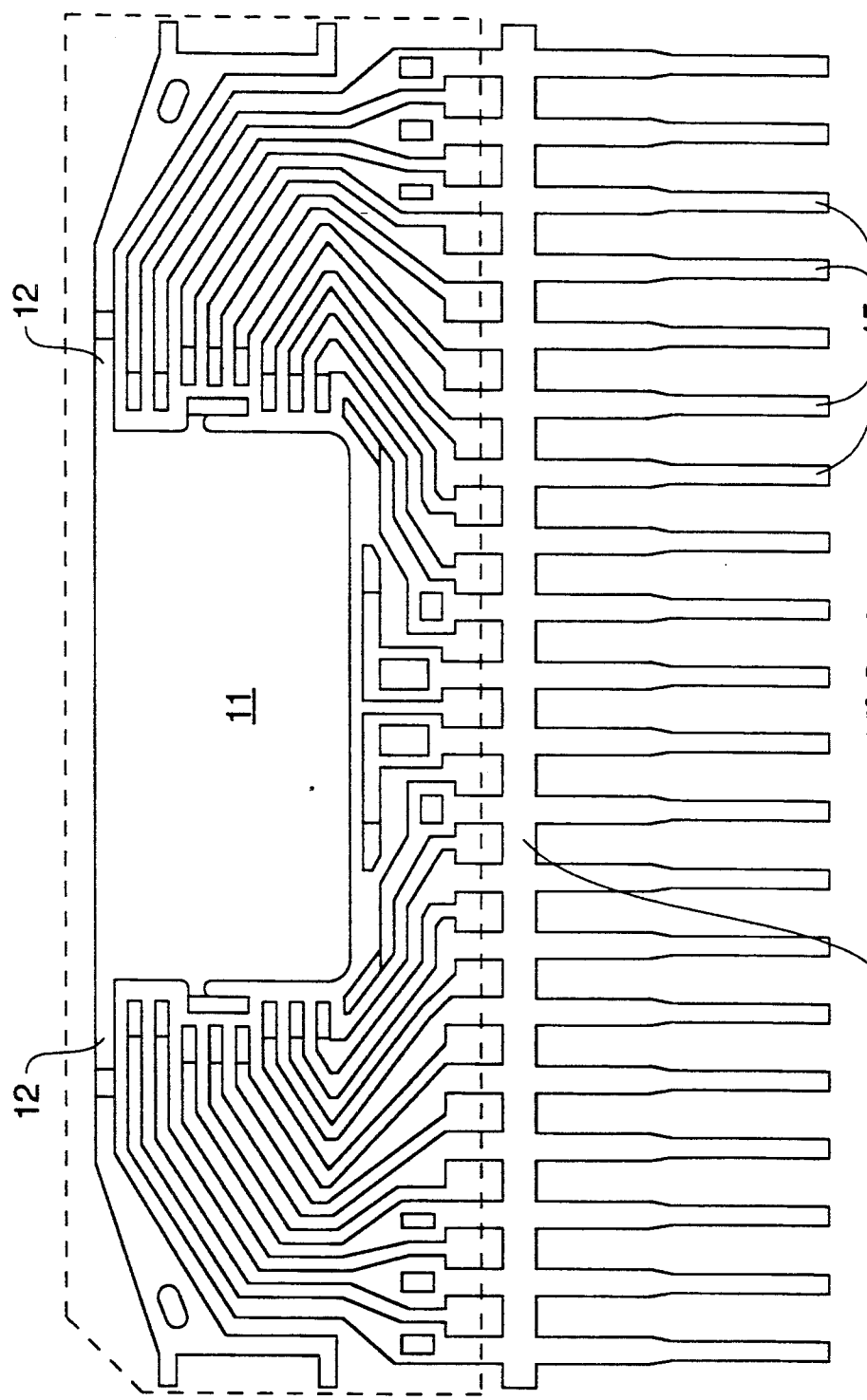
FIG. 1 is a top schematic view of part of a zig zag inline (ZIP) lead frame showing typical long tie bars attached to opposing ends of one longer side of a rectangular shaped die attach pad.

Referring to FIG. 1, prior art is illustrated in a top schematic view of a part of a typical conventional zig zag inline (ZIP) lead frame showing, in the center of the upper portion of the view, a die attach pad 11 of generally rectangular shape, with a plurality of tie bars 12 extending in the same plane from opposing corners on one longer side of the die attach pad. The tie bars are each attached, in a known way, on their opposing ends, to the appropriate side of the opposing parallel sides of the lead frame, not shown, in the same plane as the lead frame. Each tie bar is downset in a known way between the two planes. Essentially the die attach pad is held and supported only on opposing corners of one longer side.

Experience has shown that this design is particularly sensitive to distortion of the horizontal plane of the pad by external forces imposed by the wirebond and encapsulation steps. The multiple lead fingers are arranged in a known way, in generally parallel spaced relationship, to allow attachment of lead wires to the opposing narrow ends and the longer side of the die pad opposite to and parallel to the tie bars supporting the die attach pad.

Figure 2:
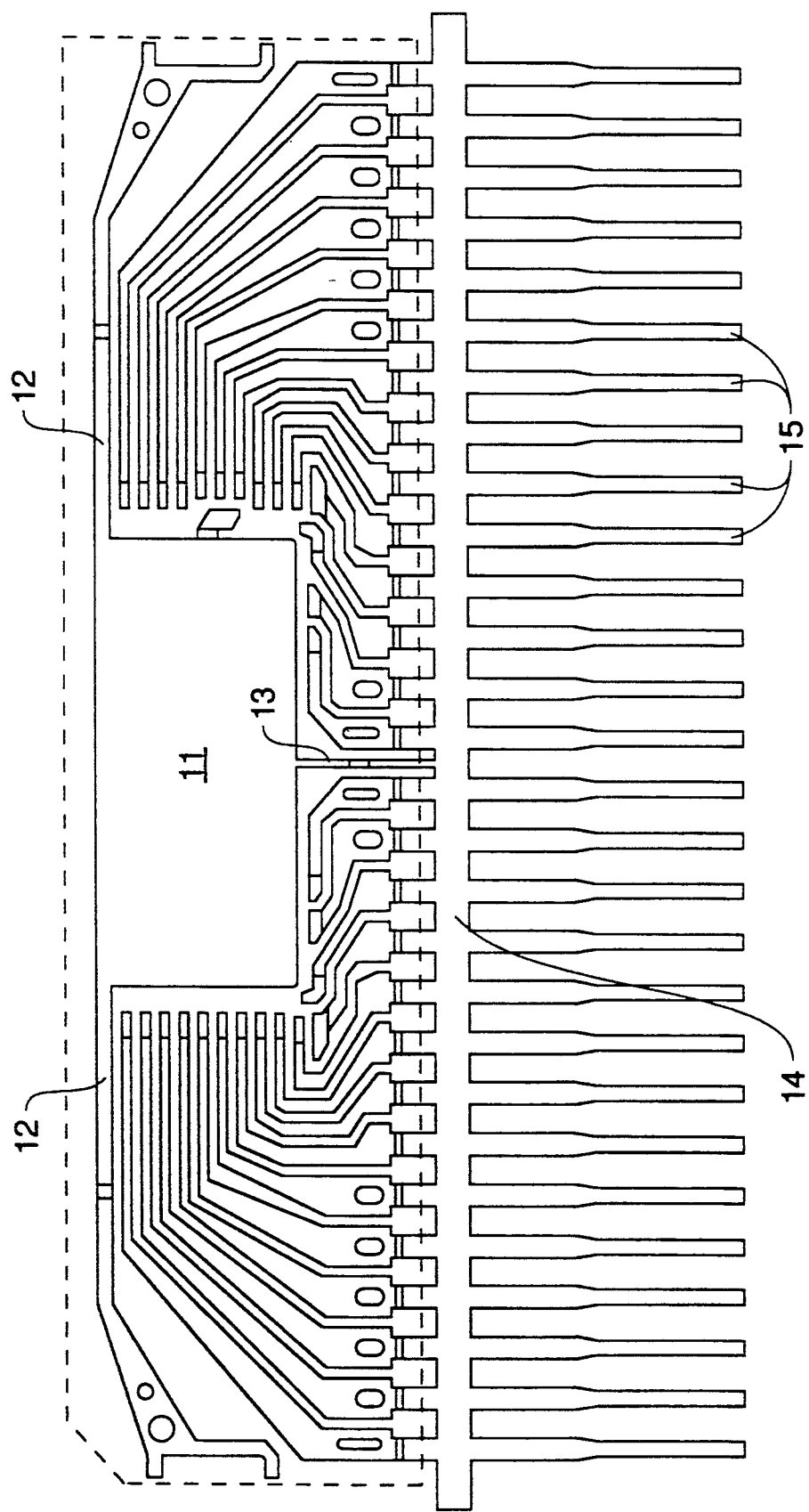
FIG. 2 is a top schematic view of part of a zig zag inline (ZIP) lead frame showing typical long tie bars attached to opposing ends of one longer side of a rectangular shaped die attach pad and a third shorter tie bar attached midway to the opposing longer side of the die attach pad normal to the long tie bars.

Referring to FIG. 2, prior art is illustrated in a variation of the configuration shown in FIG. 1. Here, the long side of the die attach pad opposing and parallel to the long side having the long, downset tie bars 12, has a short tie bar 13, downset in a known way and extending in the same plane normal to and from a point midway between the opposing ends of the long side. The opposing end of this short tie bar is attached normal to and in the same plane, to the support structure 14 of the lead frame which holds the multiple lead fingers 15 in parallel spaced relationship. Thus, the die attach pad is supported equilaterally at three points.

Experience has shown that while this design generally is superior to that shown in FIG. 1, in its ability to withstand the various physical forces encountered in the wirebond and encapsulation steps, there is still significant die pad deflection resulting in excessive package bowing.

The preferred embodiment differs from the conventional lead frame configurations described above principally because of the novel introduction of a long beam, extending generally parallel to a long side of the die pad and to which at least two short tie bars are attached, which on their opposing ends, are attached to the long side of the die pad. The long beam is attached on its opposing ends to opposing sides of the lead frame. A third tie bar is attached to the opposing side of the die pad and to the multiple lead support structure, resulting in, at least a three point support for the die pad, in a generally equilateral configuration, to be described.

Figure 3:
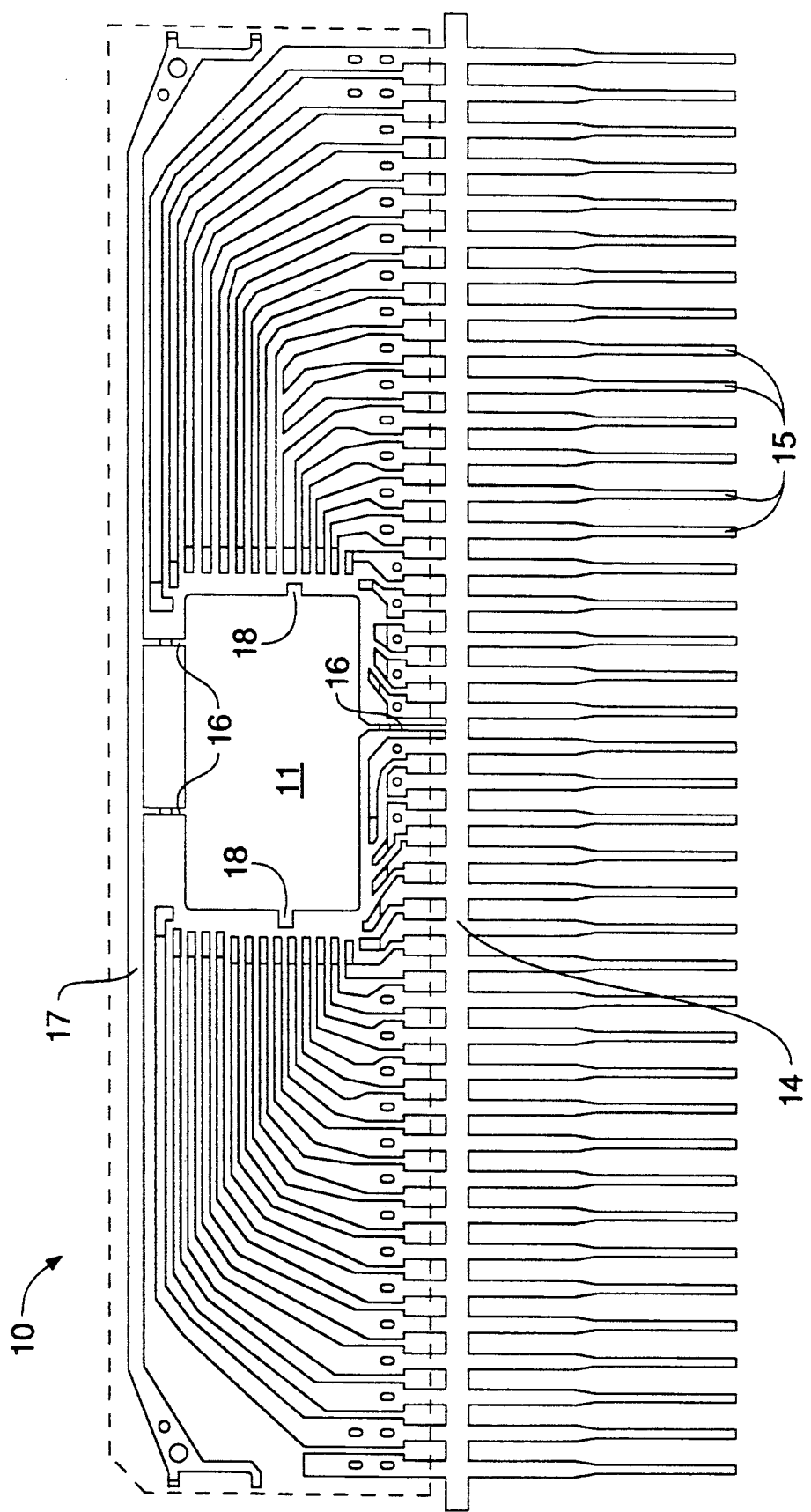
FIG. 3 is a top schematic view of part of a zig zag inline (ZIP) lead frame showing a novel long support beam and multiple short tie bars attached symmetrically and parallel and equilaterally to the die attach pad.

Referring to FIG. 3, there is shown a schematic top view of a partial lead frame configuration which generally is designated by the numeral 10. The lead frame, commonly designated as zig zag inline (ZIP), is formed of a thin metal sheet of suitable known composition and thickness, with two parallel edges or sides, sometimes referred to as rails, not shown.

In this preferred embodiment, the die attach pad 11, is of generally rectangular shape and is located centrally between the sides of the lead frame, with the two opposing longer sides of the pad normal to the lead frame sides and parallel to and downset, in a known manner, from the plane of the multiple lead fingers 15 and their support structures 14, which comprise integral parts of the lead frame. The multiple lead fingers 15 generally extend away from the pad on one longer side and both opposing ends in the same plane as the lead frame and in parallel spaced relationship and are held by multiple support structures 14, also known as dam bars, also in the same plane. The support structures are an integral part of and extend normal to and between and are attached on opposing ends to the opposing parallel sides of the lead frame, not shown.

Furthermore, in the preferred embodiment, the die attach pad is supported and secured on one longer side by one single tie bar 16, downset to, in a known way, and attached on one end, normal to and approximately midway between the opposing ends of the longer side, with the opposing end attached to and normal to the lead finger support structure 14. The actual location of the tie bar is determined by the design constraints of the multiple parallel lead finger relationships and may depart slightly from a midway location, as shown in FIG. 3.

The die attach pad 11 is also supported and secured on the opposing longer side by a plurality of tie bars 16 in parallel spaced relationship to each other and to the opposing tie bar. These tie bars are approximately equidistant from each other and from the opposing ends of the long side of the die attach paddle. They are also attached on their opposing ends to a novel long support beam 17 of appropriate width and strength which extends parallel to the long side of the die attach paddle and in the same plane as the lead frame. The opposing ends of the support beam are configured generally to conform to the lead finger design constraints and are attached in a known way to the opposing sides, not shown, the lead frame. The support beam is not allowed to be attached to the lead frame at the top of the ZIP package to prevent shorting the device to features located there, not shown. The short tie bars are downset, in a known way, from the long support bar 17 to the die attach paddle 11.

The precise location on the die paddle of the plurality of tie bars which are attached to the long support beam 17 is determined generally by the selected position of the single tie bar on the opposing side, discussed above. The intent of the placement of the three tie bars, in this preferred embodiment, is to provide, as practicably as possible, an essentially equilateral and symmetrical support for the die attach paddle, during the wire bond encapsulation and steps of the IC assembly process. As seen in FIG. 3, the two tie bars opposing the single tie bar are shifted slightly along the die attach paddle to provide dimensional and dynamic equality and symmetry with the selected position of the single tie bar.

The die attach paddle also has typical "ears" 18 on opposing ends of known design, which provide for electrical control of the backside voltage of the attached die, not shown.

From the above discussion, it may be seen that support of the die attach paddle in a typical zig zag inline lead frame may be accomplished in a novel and improved manner by employing supporting beam and a plurality of typically downset tie bars, attached in positions and of dimensions to provide optimum stability and resistance to the distorting forces commonly encountered in the wire bond and encapsulating steps of the IC assembly process.

From the description it may also be apparent that appropriate design of the array of the multiple lead fingers may permit the location of a plurality of opposing tie bars on the die attach pad, support structure and long support beam, to achieve virtually any degree of die attach paddle support and stability required, within the design constraints o the integrated circuit assembly.

The present invention has been described in a preferred embodiment and typical variation of that embodiment but many modifications and variations may become apparent to those skilled in the art. However, the scope of the present invention is not limited by the above described details but only by the appended claims.

We claim:

1. An integrated circuit package zig zag inline multiple lead frame configuration to be used to reduce bowing and bending during integrated circuit assembly, the lead frame comprising:

a) a plurality of conventional lead fingers, held in generally parallel spaced relationship by a conventional and integral support structure, each finger conventionally attached on one end to the lead frame and extending in a known way to the proximity of the edge of a conventional downset die attach paddle, for the purpose of conventional multiple electrical connection to a conventional die;

b) a tie bar support beam which is in the same plane as and attached, on its opposing ends, to opposing sides of the lead frame, extending generally parallel and adjacent to a long side of said downset die paddle and providing attachment and support for a plurality tie bars, which are attached on their opposing ends to the long side of said downset die paddle adjacent to said support beam, in order to help secure and support the downset die attach paddle in proper planar relationship during encapsulation of the integrated circuit assembly;

c) at least one downset tie bar attached on one end to the multiple lead finger support structure and on its opposing end to a side of the die attach paddle not adjacent to the tie bar support beam, in order to help secure and support the downset die attach paddle in proper planar relationship during encapsulation of the integrated circuit assembly.

* * * * *